United States Patent [19]
Kubota

[11] Patent Number: 5,276,650
[45] Date of Patent: Jan. 4, 1994

[54] MEMORY ARRAY SIZE REDUCTION

[75] Inventor: Satoshi Kubota, Baraki, Japan

[73] Assignee: Intel Corporation, Santa Clara, Calif.

[21] Appl. No.: 921,892

[22] Filed: Jul. 29, 1992

[51] Int. Cl.⁵ .............................................. G11C 7/00
[52] U.S. Cl. ................................ 365/207; 365/230.05; 365/190
[58] Field of Search ............... 365/189.02, 189.04, 365/189.07, 190, 207, 208, 230.04, 205, 230.05

[56] References Cited
U.S. PATENT DOCUMENTS
4,954,987 9/1990 Auvinen et al. ................ 365/230.04

*Primary Examiner*—Joseph A. Popek
*Attorney, Agent, or Firm*—Blakely, Sokoloff, Taylor & Zafman

[57] ABSTRACT

An apparatus and method for reducing the size of memory arrays which are comprised of memory cells which use bit lines to access the cells. Adjacent cells in a row are assigned different word lines so that bit lines between adjacent cells can be shared. During the read and write cycles, bit lines of a row are selected by alternating the word lines and by setting corresponding sense amplifier selectors. By sharing bit lines in this way, the size of the memory array can be decreased significantly. Therefore, using the teachings of the present invention, a given amount of memory can be manufactured in a significantly smaller area. Alternately, significantly more memory can be stored in the same amount of area as would be required using a usual memory design.

27 Claims, 5 Drawing Sheets

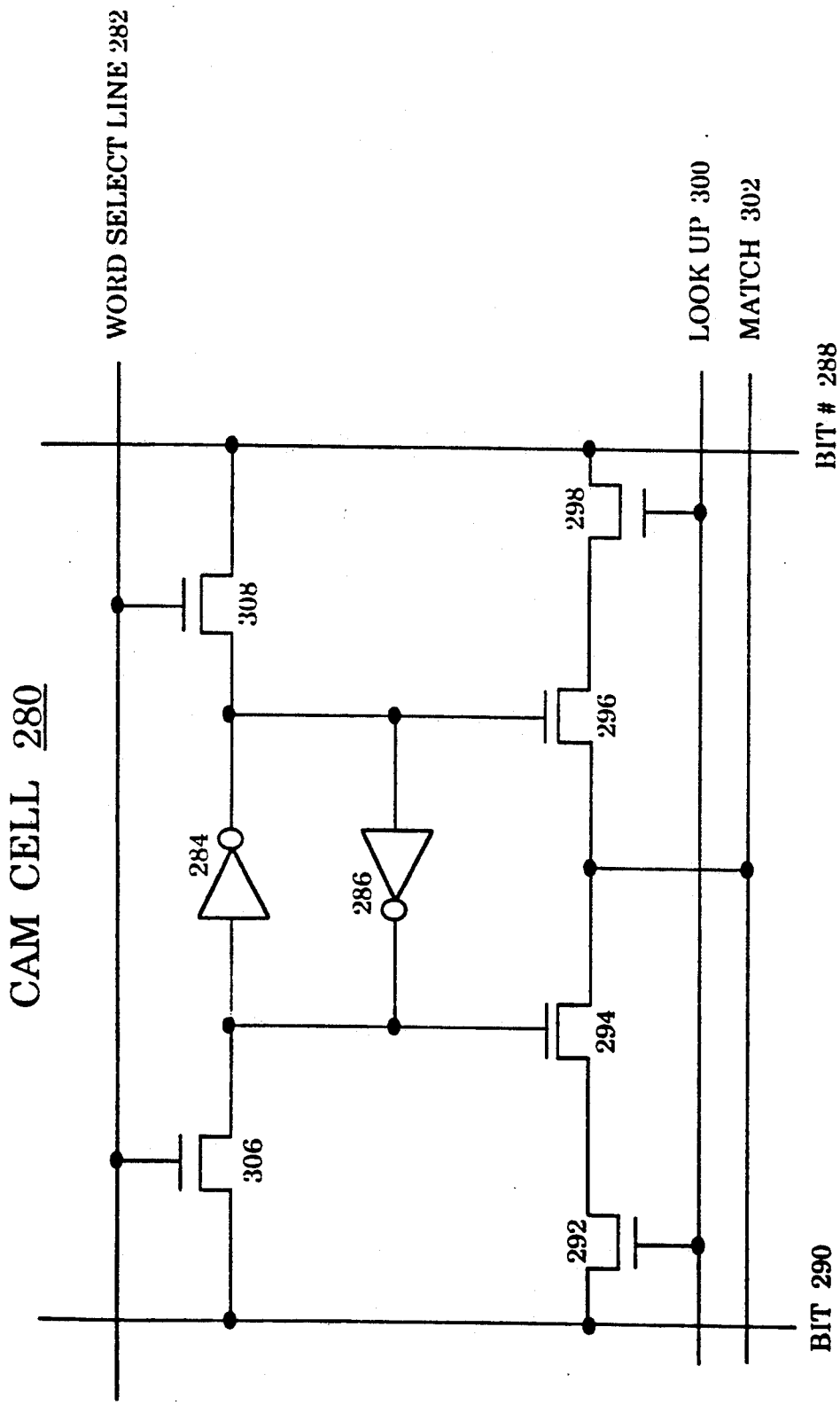
FIGURE 5 - PRIOR ART

5,276,650

MEMORY ARRAY SIZE REDUCTION

BACKGROUND OF THE INVENTION

(1) Field of the Invention

The present invention relates to a method and apparatus for reducing the size of memory arrays in an integrated circuit chip. More specifically, the present invention implements bit line sharing in highly parallel memory structures.

(2) Art Background

It is quite common for memory storage to comprise semiconductor memories organized in rectangular arrays of rows and columns on very-large-scale integrated (VLSI) circuits. The intersection of one row and one column results in a storage element called a "cell". Each cell is capable of storing a binary bit of data. To write data into, and to read data from, a row or column of cells, an address is assigned to each row or column of cells. Access to the address is provided in a binary-coded address presented as input to address decoders that select a row or column for a write or read operation.

Static random access memory (SRAM) is a form of semiconductor memory that is widely known and used. SRAM storage is based on the logic circuit known as the flip-flop, which retains the information stored in it as long as there is enough power to run the device. A typical SRAM cell consists of six transistors. Although each SRAM cell requires a large layout space, SRAM is employed in situations which require high-speed random access such as cache memory. In the usual SRAM design, each cell has one word line and two bit lines (BIT and BIT#) to access cells.

Another example of memory storage is content addressable memory (CAM) which is a memory-based storage method in which data items are accessed, not by reference to some fixed address or location, but by analysis of their content. CAM enables one to look up matched data at a very high speed without reading out the content of the memory. It is used particularly in small, high-speed cache devices in order to determine whether a virtual memory page (a special type of storage) is present. In the usual design, each CAM cell has two bit lines (BIT and BIT#). A usual CAM cell is comprised of 10 transistors and also requires a large layout space.

SUMMARY OF THE INVENTION

It is therefore an object of the present invention to decrease the size of memory arrays residing on an integrated circuit thereby permitting a larger amount of memory to be stored in a given area, or thereby permitting a given amount of memory to be manufactured in a smaller area.

It is a further object of the present invention to realize cost reduction benefits associated with placing more memory in a given area, thereby reducing the amount of materials required to fabricate the memory.

An apparatus and method are disclosed for reducing the size of memory arrays which are comprised of memory cells. Word lines are used to select memory cells of the memory array. At least one bit line per selected cell is used to access the selected cells.

Each row is provided with two word lines. Adjacent cells in a row are assigned different word lines. There is only one bit line between each pair of adjacent cells. The bit line between the pair of adjacent calls is selectively coupled to each cell of the pair of adjacent cells. Thus, each bit line between adjacent cells is shared by the adjacent cells.

During read and write cycles, no more than one word line is asserted. Asserting the word line, selects which cell, of each pair of adjacent cells of the row, is coupled to a particular bit line. In this way, particular bit lines are coupled to one cell of each pair of adjacent cells of the row. Sense amplifier selectors corresponding to the bit lines are also set so that each bit line will be a coupled to the appropriate selected cell corresponding to the bit line.

By sharing bit lines in this way, the size of the memory array can be decreased significantly. Therefore, using the teachings of the present invention, a given amount of memory can be manufactured in a significantly smaller area. Alternately, significantly more memory can be stored in the same amount of area as would be required using the usual memory design.

BRIEF DESCRIPTION OF THE DRAWINGS

The objects, features and advantages of the method and apparatus of the present invention will be apparent from the following detailed description of the invention in which:

FIG. 5 illustrates a single content addressable memory (CAM) cell.

DETAILED DESCRIPTION OF THE INVENTION

An apparatus and method is disclosed for reducing the size of memory arrays by permitting adjacent memory cells in a row to share bit lines. In the following description, for the purposes of explanation, specific devices, signals and data structures are disclosed in order to more thoroughly understand the present invention. However, it will be apparent to one skilled in the art that the present invention may be practiced without these specific details. In other instances, well-known circuits, devices and data structures are not disclosed herein to avoid obscuring the present invention unnecessarily.

Figure 1:
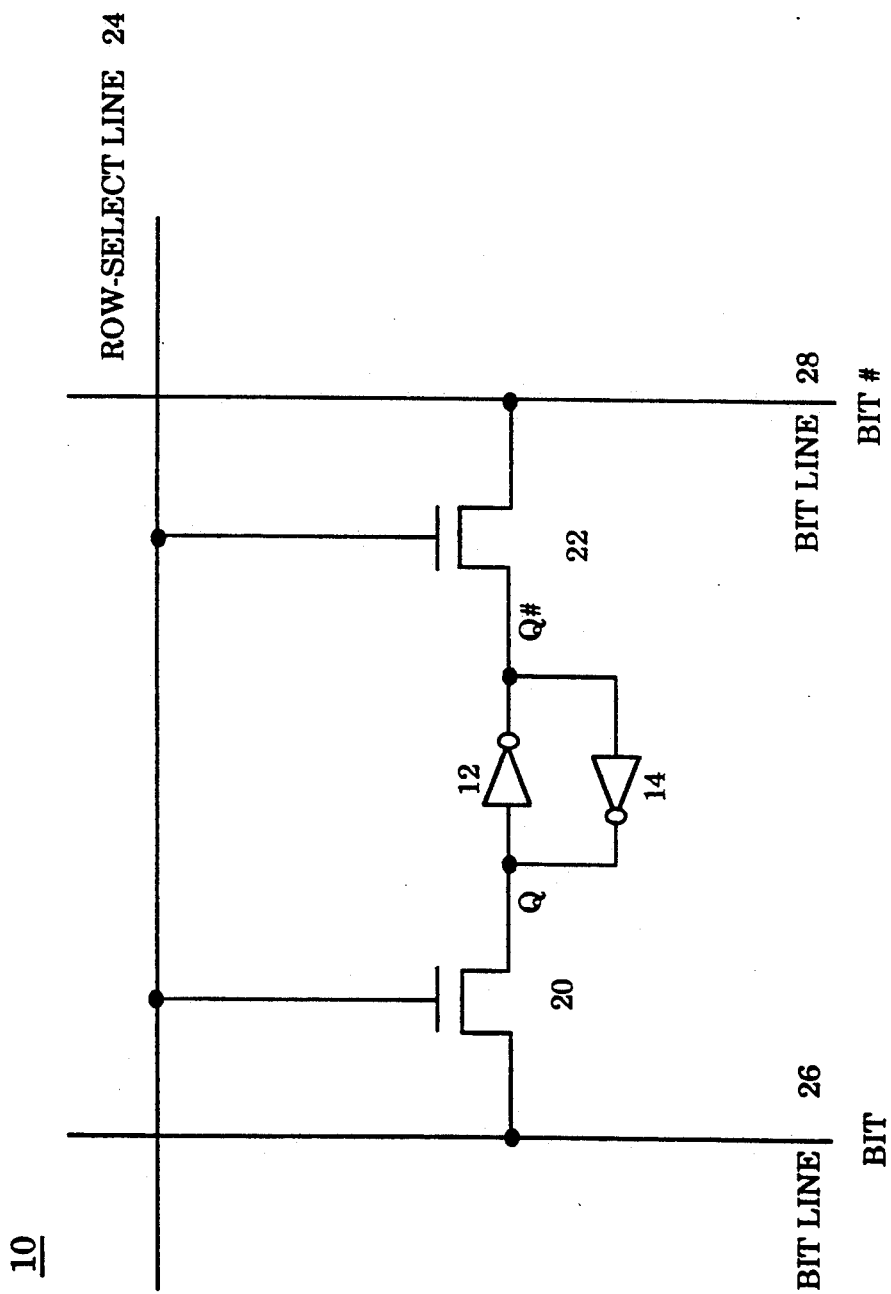
FIG. 1 illustrates a single static random access memory (SRAM) cell.

Referring now to FIG. 1, a typical static random access memory (SRAM) cell 10 is depicted. The SRAM cell 10 contains metal-oxide semiconductor field-effect transistors (MOSFETs) 20-22 and inverters 12-14. Inverter 12 is cross-coupled to inverter 14. Together inverters 12-14 form a storage flip-flop capable of holding one bit of information.

Transistors 20-22 are transfer gates. With the ROW-SELECT line 24 LOW, transistors 20 and 22 are OFF, and the cell is isolated from the bit lines 26-28. In a READ operation, when ROW-SELECT line 24 goes HIGH, transistors 20 and 22 provide coupling and Q appears on bit line 26 (BIT). A sense amplifier (not shown) connected to the bit lines 26-28 provides buffering, and the proper logic level appears on the data output line. In a WRITE operation, the selected row of cells is connected to the bit lines 26-28 and Q is SET or RESET by a one placed on bit line 26 (BIT) or 28 (BIT#) by the write amplifier (not shown). In this SRAM cell 10 with nondestructive readout, the state of the flip-flop is not altered by the READ operation, and the state persists as long as power is supplied to the chip.

Signal BIT# is an inversion of signal BIT. When signal BIT is logical one, signal BIT# will be logical zero. On the other hand, when signal BIT is logical zero, signal BIT# is logical one. Therefore, in any memory array which uses BIT and BIT# signals, it is possible to eliminate one of the bit lines 26-28 and its corresponding transistor 20-22. However, pairs of bit lines 26-28 are commonly used to increase the reliability of the memory array.

Figure 2:
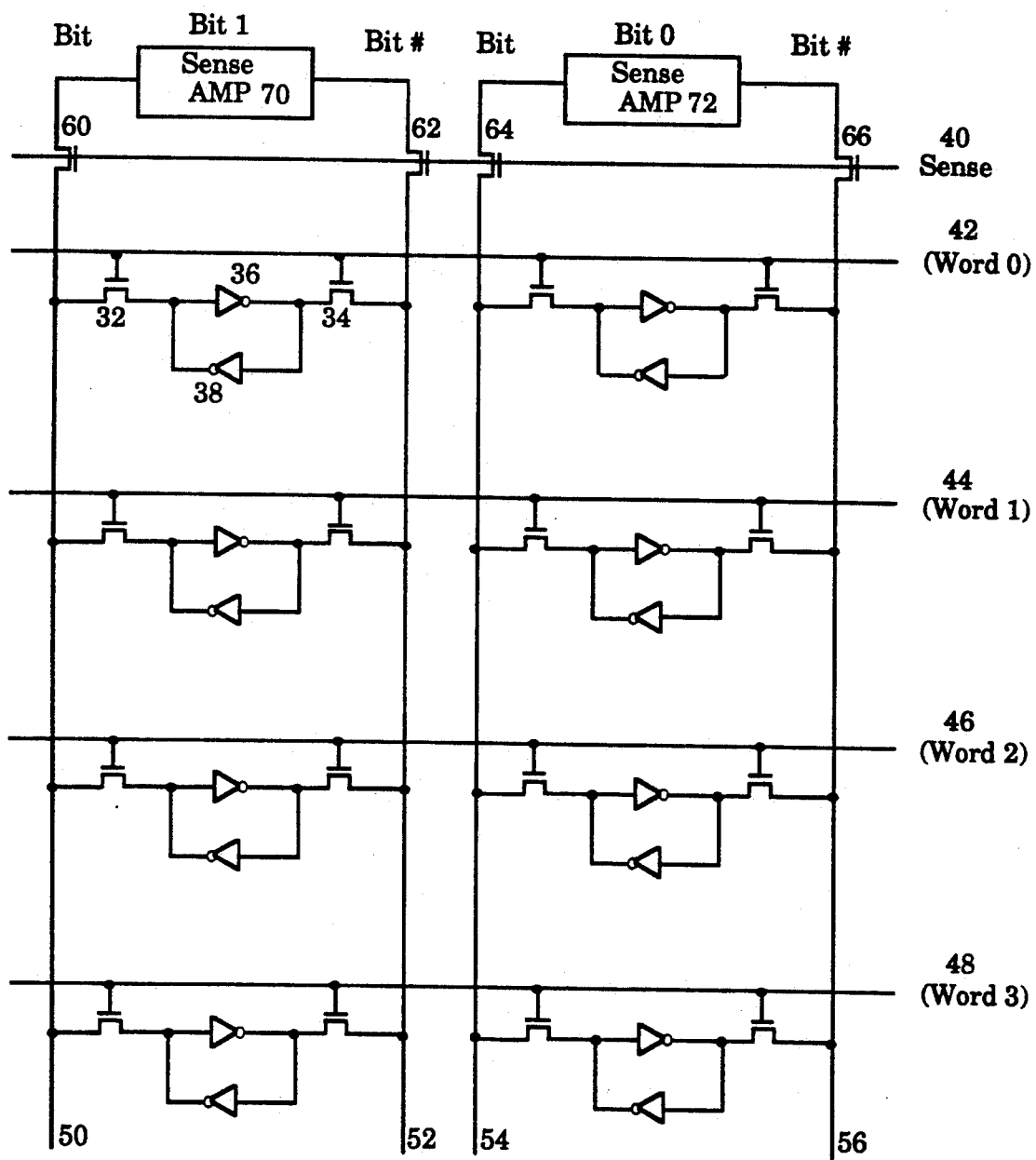
FIG. 2 illustrates a usual two bit by four word single port SRAM array.

Referring now to FIG. 2, an ordinary two bit by four word single port SRAM circuit 30 is illustrated. The circuit 30 contains eight individual SRAM cells. For example, a SRAM cell for bit 1 of word 0 is formed by transfer gate transistors 32-34 and inverters 36-38.

A particular word is selected to be read to, or written from, by individually enabling word selection lines 42-48 which correspond to words 0-3, respectively. Bit lines 50 (BIT) and 53 (BIT#) coupled the SRAM cells for bit 1 of words 0-3 to sense switch transistors 60 and 62, respectively. Transistors 60 and 62 are coupled to the bit 1 sense amplifier 70 and to sense line 40. Similarly, bit lines 54 (BIT) and 56 (BIT#) couple the SRAM cells for bit 0 of words 0-3 to sense switch transistors 64 and 66, respectively. Transistors 64 and 66 are coupled to the bit 0 sense amplifier 72 and to sense line 40. Activating sense line 40 causes transistors 60-62 to couple sense amplifier 70 to bit lines 50-52 and causes transistors 64-66 to couple sense amplifier 72 to bit lines 54-56.

When writing data to the cells, data for each bit is written to the selected word depending upon whether signal line BIT or BIT# for each cell is pulled down by a pull down device (not shown). When reading data from the cells, both BIT and BIT# are precharged by a precharge circuit (not shown). When the appropriate word selection line 42-48 is activated for the cells, both transfer gates are turned on for each cell of the word. Then, depending upon the data that is inside the selected SRAM cells, one of the bit lines (BIT or BIT#) is discharged quickly through the inverter and a sense amplifier detects that weak pull down.

Figure 3:
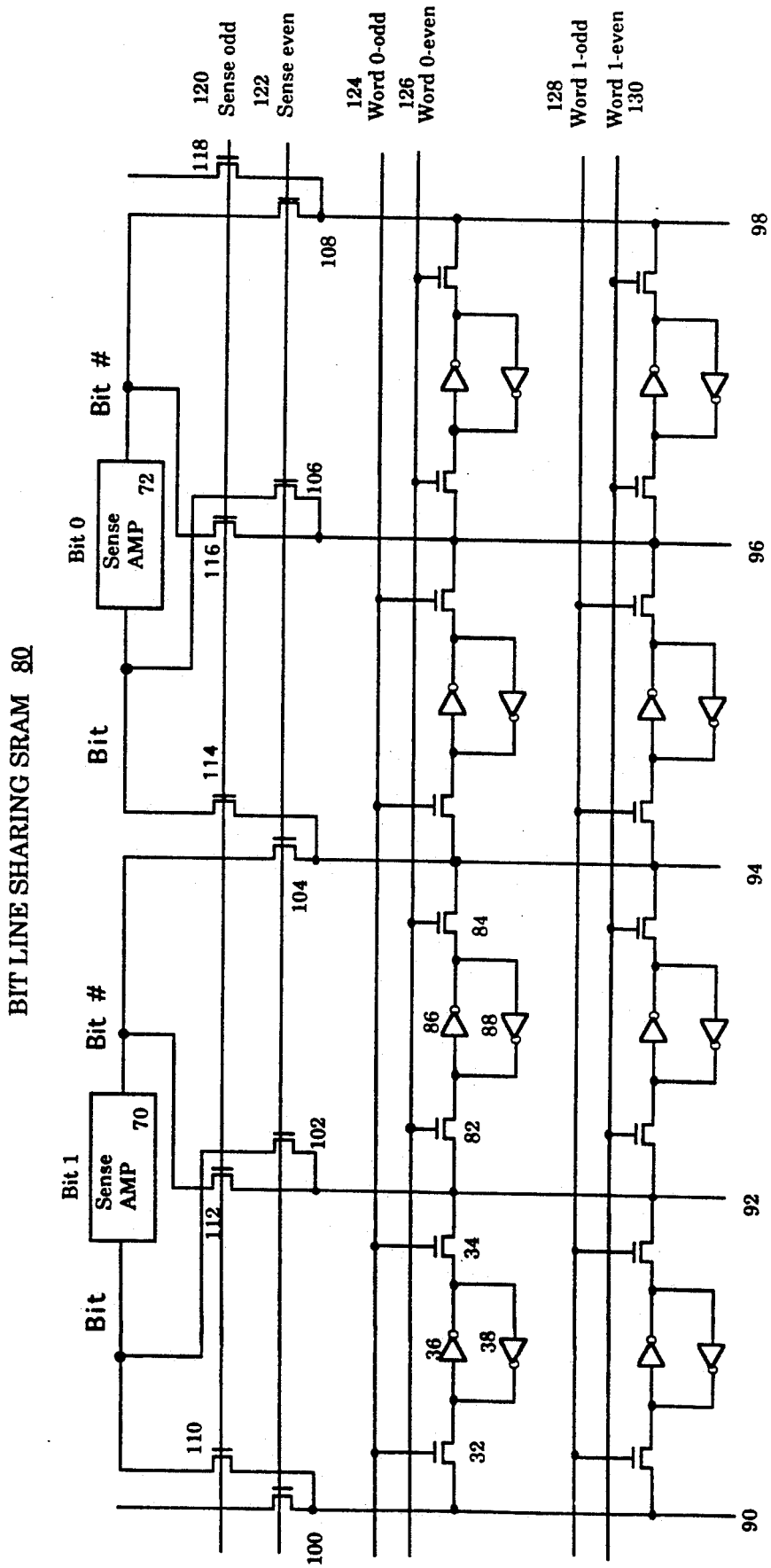
FIG. 3 illustrates a single port SRAM which utilizes bit line sharing.

Referring now to FIG. 3, a single port two bit by four word SRAM circuit 80 which uses the teachings of the present invention to share bit lines is depicted. In the circuit 80, eight SRAM cells are arranged so that adjacent cells in each row have different word selection lines 124-130. Hence, there is an odd word selection line 124, 128 and an even word selection line 126, 130 for each row. This permits adjacent cells in a row to share a common bit line 90-98.

Thus, for example, a SRAM cell for bit 1 of word 0-odd is formed by transfer gate transistors 32-34 and inverters 36-38. Similarly, a SRAM cell for bit 1 of word 0-even is formed by transfer gate transistors 82-84 and inverters 86-88. Asserting word selection line word 0-odd 124 causes transfer gate transistors 32-34 to couple the word 0-odd bit 1 SRAM cell to common bit lines 90-92. Then, asserting sense odd line 120 causes sense switching transistors 110 and 112 to couple common bit lines 90-92 to bit 1 sense amplifier 70. On the other hand, asserting word selection line word 0-even 126 causes transfer gate transistors 82-84 to couple the word 0-even bit 1 SRAM cell to common bit lines 92-94. Then, asserting sense even line 122 causes sense switching transistors 102 and 104 to couple common bit lines 92-94 to bit 1 sense amplifier 70. In this way, the SRAM cells for bit 1 of word 0-odd and word 0-even share common bit line 92.

In the present invention, bit lines 90-98 are precharged as in the usual design. During the read and write cycles, bit line pairs for a word are selected by asserting either the odd or the even word selection line for the word (i.e. asserting word selection line word 0-odd 124 or word selection line word 0-even 126 for word 0 and asserting word selection line word 1-odd 128 or word selection line word 1-even 130 for word 1). The corresponding sense selection line is also asserted (i.e. assert sense odd line 120 if word 0-odd selection line 124 or word 1-odd selection line 128 is asserted and assert sense even line 122 if word 0-even selection line 126 or word 1-even selection line 130 is asserted).

Therefore, for example, word 0-odd would be read by activating word selection line word 0-odd 124. At the same time, sense odd line 120 would also be activated thereby causing bit 0 and bit 1 of word 0-odd to be coupled to the bit 0 sense amplifier 72 and to the bit 1 sense amplifier 70, respectively. In a similar manner, word 0-even would be read by activating word selection line word 0-even 126. At the same time, sense even line 122 would also be activated thereby causing bit 0 and bit 1 of word 0-even to be coupled to the bit 0 sense amplifier 72 and to the bit 1 sense amplifier 70, respectively. Because there is a sharing of bit lines in the present invention, sense odd line 120 and sense even line 122 are used to select which data will go to the sense amplifiers 70-72 to eliminate contention between cells which share bit lines.

While the present invention adds the extra step or control of selecting an odd or even sense line 120-122, there is no reduction in access speed for the present invention circuitry over usual SRAM circuitry. This is because, even in a usual SRAM circuit, a word line has more cells than there are data bus line bits for the SRAM. Therefore, even in the usual SRAM circuit, there must be control circuitry to select a sub-set of the cells in a line which form a word. These controls would need to be modified based on the new cell implementation of the present invention. However, modification is not a difficult step since the control circuitry is well known in the art. The control circuitry to add depends on the addressing scheme employed by the SRAM design. However, one approach would be to have one bit of the address represent whether an odd or an even word is being addressed. Then, if the assigned bit contained a value of one, the sense odd line 120 would be asserted. If, on the other hand, the assigned bit contained a value of zero, the sense even line 122 would be asserted.

By sharing bit lines using the teachings of the present invention it is possible to make a memory array smaller than could be realized using the conventional design for the same amount of memory. This permits a smaller memory to be developed which in turn means that less materials are used to manufacture a given amount of memory. Alternately, a larger amount of memory can be stored on a given area of an integrated circuit wafer than would be possible to be stored using a usual SRAM design.

Figure 4:
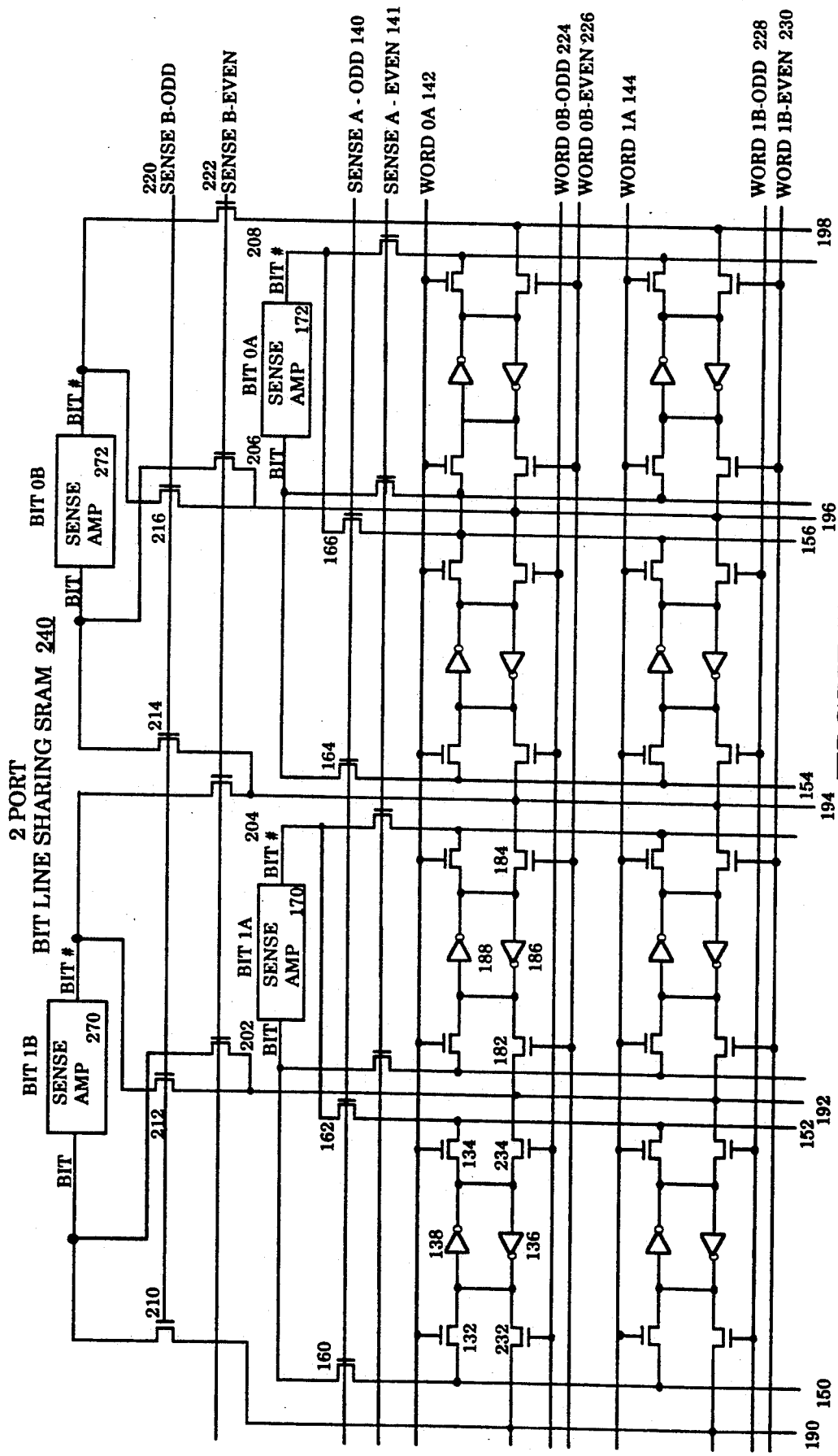
FIG. 4 illustrates a dual port SRAM which utilizes bit line sharing.

Referring now to FIG. 4, a two port SRAM 240 which utilizes the teachings of the present invention is depicted. In a two port SRAM, two words may be written to, or read from, simultaneously. In the memory array depicted, the first port (port A) is implemented using a scheme where there is no bit line sharing. The second port (port B) implements bit line sharing for adjacent cells in a row. SRAM cell size reduction is achieved by sharing diffusion of the port B bit lines between the adjacent cells.

The circuit 240 contains eight individual SRAM cells. Each of the SRAM cells can be accessed through port A or through port B. For example, a dual port SRAM cell is formed by transfer gate transistors 132-134 (for port A), 232-234 (for port B) and inverters 136-138. The dual port SRAM cell can be accessed through port A as bit 1A-odd of word 0A-odd. The same SRAM cell can also be accessed through port B as bit 1B of word 0B-odd.

When accessing a particular word through port A, the word is selected to be read to, or written from, by individually enabling word selection lines 142-144 which correspond to words 0A and 1A, respectively. Bit lines 150 (BIT) and 152 (BIT#) couple the SRAM cells for bit 1A-odd of words 0A-odd and 1A-odd to sense switch transistors 160 and 162, respectively. Transistors 160 and 162 are coupled to the bit 1A sense amplifier 170 and to sense A-odd line 140. Similarly, bit lines 154 (BIT) and 156 (BIT#) couple the SRAM cells for bit 0A-odd of words 0A-odd and 1A-odd to sense switch transistors 164 and 166, respectively. Transistors 164 and 166 are coupled to the bit 0A sense amplifier 172 and to sense A-odd line 140. Activating sense A-odd line 140 causes transistors 160-162 to couple sense amplifier 170 to bit lines 150-152 and causes transistors 164-166 to couple sense amplifier 172 to bit lines 154-156.

When writing data to the cells, data for each bit is written to the selected word depending upon whether signal line BIT or BIT# for each cell is pulled down. When reading data from the cells, both BIT and BIT# are precharged. When the appropriate word selection line 142-144 is activated for the cells, both transfer gates are turned on for each cell of the word. Then, depending upon the data that is inside the selected SRAM cells, one of the bit lines (BIT or BIT#) is discharged quickly through the inverter and a sense amplifier detects that weak pull down. Similar circuitry is used to access bit 1A-even and bit 0A-even of words 0A or 1A through port A. This access occurs when sense A-even line 141 is activated along with word 0A or 1A selection line 142-144, respectively.

Referring now to port B of SRAM circuit 240, port B uses the teachings of the present invention to share bit lines. In the circuit 240, the eight SRAM cells are arranged so that adjacent cells in each row have different word selection lines 224-230. Hence, there is an odd word selection line 224, 228 and an even word selection line 226, 230 for each row. This permits adjacent cells in a row to share a common bit line 190-198.

Thus, for example, a SRAM cell for bit 1B of word 0B-odd is formed by transfer gate transistors 232-234 and inverters 136-138. Similarly, a SRAM cell for bit 1B of word 0B-even is formed by transfer gate transistors 182-184 and inverters 186-188. Asserting word selection line word 0B-odd 224 causes transfer gate transistors 232-234 to couple the word 0B-odd bit 1B SRAM cell to common bit lines 190-192. Then, asserting sense B-odd line 220 causes sense switching transistors 210 and 212 to couple common bit lines 190-192 to bit 1B sense amplifier 270. On the other hand, asserting word selection line word 0B-even 226 causes transfer gate transistors 182-184 to couple the word 0B-even bit 1B SRAM cell to common bit lines 192-194. Then, asserting sense B-even line 222 causes sense switching transistors 202 and 204 to couple common bit lines 192-194 to bit 1B sense amplifier 270. In this way, the SRAM cells for bit 1B of word 0B-odd and word 0B-even share common bit line 192.

In the present invention, bit lines 190-198 are precharged as in the usual design. During the read and write cycles, bit line pairs for a word are selected by asserting either the odd or the even word selection line for the word (i.e. asserting word selection line word 0B-odd 224 or word selection line word 0B-even 226 for word 0B or asserting word selection line word 1B-odd 228 or word selection line word 1B-even 230 for word 1). The corresponding sense selection line is also asserted (i.e. assert sense B-odd line 220 if word 0B-odd selection line 224 or word 1B-odd selection line 228 is asserted or assert sense B-even line 222 if word 0B-even selection line 226 or word 1B-even selection line 230 is asserted).

Therefore, for example, word 0B-odd would be read by activating word selection line word 0B-odd 224. At the same time, sense B-odd line 220 would also be activated thereby causing bit 0B and bit 1B of word 0B-odd to be coupled to the bit 0B sense amplifier 272 and to the bit 1B sense amplifier 270, respectively. In a similar manner, word 0B-even would be read by activating word selection line word 0B-even 226. At the same time, sense B-even line 222 would also be activated thereby causing bit 0B and bit 1B of word 0B-even to be coupled to the bit 0B sense amplifier 272 and to the bit 1B sense amplifier 270, respectively. Because there is a sharing of bit lines in the present invention, sense B-odd line 220 and sense B-even line 222 are used to select which data will go to the sense amplifiers 270-272 to eliminate contention between cells which share bit lines.

It will be obvious that the bit line sharing teachings of the present invention are readily extendible by one skilled in the art to memory arrays having more than two ports. It will also be obvious that each port of the memory array can be implemented with or without bit line sharing. Furthermore, it is will be obvious that multiple port memory arrays comprising single bit line memory cells can be constructed using the teachings of the present invention.

By sharing bit lines using the teachings of the present invention it is possible to make a memory array smaller than could be realized using the conventional design for the same amount of memory. This permits a smaller memory to be developed which in turn means that less materials are used to manufacture a given amount of memory. Alternately, a larger amount of memory can be stored on a given area of an integrated circuit wafer than would be possible to be stored using a usual SRAM design.

Referring now to FIG. 5, a single content addressable memory (CAM) cell 280 is illustrated. The CAM cell 280 operates in a manner similar to a SRAM cell. Asserting Word Select Line 282 causes transfer gate transistors 306 and 308 to couple the flip-flop formed by inverters 284-286 to bit lines 288-290 (BIT# and BIT). However, the CAM cell 280 has an additional four transistors (292-298) not found in a SRAM cell. When signal line LOOKUP 300 is asserted, transistors 292 and 298 provide coupling of transistors 294 and 296 to bit lines 290 and 288 (BIT and BIT#), respectively. Signal line MATCH 302 is coupled between transistors 294 and 296. Transistors 294 and 296 are coupled to the flip-flop formed by inverters 284-286 such that either transistor 294, or transistor 296, (but not both) will be on. Therefore, signal line MATCH 302 indicates whether or not the value stored in the flip-flop formed by inverters 284-286 is the same as the value asserted on bit lines 288-290 (BIT# or BIT).

It will be obvious to one skilled in the art that the bit line sharing techniques of the present invention may be applied to any other memory cell which uses bit lines to access cells (e.g., CAM cells). Thus, the present invention implements a bit line sharing scheme in highly parallel memory structures. By permitting adjacent cells in each row of a memory array to have different word lines, the bit lines of adjacent cells can be shared. This sharing of bit lines results in a significant decrease in the amount of area on an integrated circuit chip necessary to contain a given amount of memory.

While the present invention has been particularly described with reference to FIGS. 1-5 and with emphasis on certain memory structures, it should be understood that the figures are for illustration purposes only and should not be taken as limitations upon the present invention. In addition, it is clear that the methods and apparatus of the present invention has utility in any application where memory cells are accessed using bit lines. It is contemplated that numerous alternatives, modifications, variations and uses may be made, by one skilled in the art, without departing from the spirit and scope of the invention as disclosed above.

What is claimed is:

1. A computer memory array having a first port for accessing said memory array, said memory array comprising:

N memory cells, where N is an even positive integer, each memory cell used for storing a bit, said memory cells being arranged in at least one row, each row having a first memory cell located at a first end and a last memory cell located at a second end, each memory cell in the row being designated as an odd memory cell or an even memory cell, said even and odd memory cells designated by alternating cell by cell along said row such that said first memory cell is an odd memory cell and said last memory cell is an even memory cell;

an odd word selection line coupled to each of said odd memory cells in said row for selecting said odd memory cells to be accessed;

an even word selection line coupled to each of said even memory cells in said row for selecting said even memory cells to be accessed;

N/2 first shared bit lines for accessing said memory cells, each of said first shared bit lines being located between, and coupled to, an adjacent pair of said odd and even memory cells, such that each of said memory cells is coupled to one of said first shared bit lines; and first switching means, coupled to said first shared bit lines and to said first port, for providing access to said odd memory cells through said first port when said odd memory cells are selected and for providing access to said even memory cells through said first port when said even memory cells are selected.

2. The computer memory array as set forth in claim 1 wherein said memory array is constructed as an integrated circuit (IC).

3. The computer memory array as set forth in claim 1 wherein each of said memory cells is a static random access memory (SRAM) cell.

4. The computer memory array as set forth in claim 1 wherein each of said memory cells is a content addressable memory (CAM) cell.

5. The computer memory array as set forth in claim 1 wherein said memory cells are accessed using a read operation.

6. The computer memory array as set forth in claim 5 wherein said read operation comprises the steps of:
if an odd word is to be read,
asserting said odd word selection line;
switching said first switching means to access said odd memory cells;
sensing said first port to determine each said bit stored in each said odd memory cell;
and, if an even word is to be read,
asserting said even word selection line;
switching said first switching means to access said even memory cells;
sensing said first port to determine each said bit stored in each said even memory cell.

7. The computer memory array as set forth in claim 1 wherein said memory cells are accessed using a write operation.

8. The computer memory array as set forth in claim 7 wherein said write operation comprises the steps of:
if an odd word is to be written,
asserting said odd word selection line;
switching said first switching means to access said odd memory cells;
providing to said first port each said bit to be stored in each said odd memory cell;
and, if an even word is to be written,
asserting said even word selection line;
switching said first switching means to access said even memory cells;
providing to said first port each said bit to be stored in each said even memory cell.

9. The computer memory array as set forth in claim 1 further comprising at least one additional port coupled to said memory cells for accessing said memory cells concurrently with access of said memory cells through said first port.

10. The computer memory array as set forth in claim 1 wherein there are
a plurality of rows of memory cells;
a plurality of odd word selection lines; and
a plurality of even word selection lines, each row of memory cells having its own separate odd and even word selection lines, said first shared bit lines coupling corresponding memory cells of each row of memory cells and providing access through said first port to said odd and even memory cells for a selected row.

11. The computer memory array as set forth in claim 10 further comprising at least one additional port coupled to said memory cells for accessing said memory cells concurrently with access of said memory cells through said first port.

12. A computer memory array as set forth in claim 1, wherein N is at least greater than three, said memory array further comprising:
a first dedicated bit line for accessing said first memory cell, said first dedicated bit line being coupled to said first memory cell and to said first port, such that said first memory cell is coupled to said first dedicated bit line and a first bit line of said first shared bit lines and provides access to said first memory cell when said odd memory cells are selected;

a last dedicated bit line for accessing said last memory cell, said last dedicated bit line being coupled to said last memory cell and to said first port, such that said last memory cell is coupled to said last dedicated bit line and a last bit line of said first shared bit lines and provides access to said last memory cell when said even memory cells are selected;

(N/2)−1 second shared bit lines for accessing said memory cells, each of said second shared bit lines being located between, and coupled to, an adjacent pair of said even and odd memory cells except a first adjacent pair and a last adjacent pair, said first adjacent pair, formed by said first memory cell and a first even memory cell, said last adjacent pair formed by said last memory cell and a last odd memory cell, such that each of said memory cells, except said memory cells of said first and last pairs, is coupled to one of said first shared bit lines and one of said second shared bit lines; and second switching means, coupled to said second shared bit lines and to said first port, for providing access to said odd memory cells, except said first odd memory cell, through said first port when said odd memory cells are selected and for providing access to said even memory cells, except said last even memory cell, through said first port when said even memory cells are selected.

13. The computer memory array as set forth in claim 12 wherein said memory cells are accessed using a read operation.

14. The computer memory array as set forth in claim 13 wherein said read operation comprises the steps of:
if an odd word is to be read,
  asserting said odd word selection line;
  switching said first switching means to access said odd memory cells;
  switching said second switching means to access said odd memory cells;
  sensing said first port to determine each said bit stored in each said odd memory cell;
and, if an even word is to be read,
  asserting said even word selection line;
  switching said first switching means to access said even memory cells;
  switching said second switching means to access said even memory cells;
  sensing said first port to determine each said bit stored in each said even memory cell.

15. The computer memory array as set forth in claim 12 wherein said write operation comprises the steps of:
if an odd word is to be written,
  asserting said odd word selection line;
  switching said first switching means to access said odd memory cells;
  switching said second switching means to access said odd memory cells;
  providing to said first port each said bit to be stored in each said odd memory cell;
and, if an even word is to be written,
  asserting said even word selection line;
  switching said first switching means to access said even memory cells;
  switching said second switching means to access said even memory cells;
  providing to said first port each said bit to be stored in each said even memory cell.

16. The computer memory array as set forth in claim 12 further comprising at least one additional port coupled to said memory cells for accessing said memory cells concurrently with access of said memory cells through said first port.

17. The computer memory array as set forth in claim 12 wherein there are
  a plurality of rows of memory cells;
  a plurality of odd word selection lines; and
  a plurality of even word selection lines, each row of memory cells having its own separate odd and even word selection lines, said first and last dedicated bit lines and said first and second shared bit lines coupling corresponding memory cells of each row of memory cells and providing access through said first port to said odd and even memory cells for a selected row.

18. The computer memory array as set forth in claim 17 further comprising at least one additional port coupled to said memory cells for accessing said memory cells concurrently with access of said memory cells through said first port.

19. The computer memory array as set forth in claim 1 wherein said memory cells are accessed using a write operation.

20. A method for accessing memory cells of a computer memory array having a first port, said memory array comprising N said memory cells, where N is an even positive integer, each memory cell used for storing a bit, said memory cells being arranged in at least one row, each row having a first memory cell located at a first end and a last memory cell located at a second end, each memory cell in the row being designated as an odd memory cell or even memory cell, said odd and even memory cells designated by alternating cell by cell along said row such that said first memory cell is an odd memory cell and said last memory cell is an even memory cell, said memory array having N/2 first shared bit lines, each of said first shared bit lines being located between, and coupled to, an adjacent pair of said odd and even memory cells, such that each of said memory cells is coupled to one of said first shared bit lines, said memory array having a first switching means, coupled to said first shared bit lines and to said first port, for providing access to said odd memory cells through said first port when said odd memory cells are selected and for providing access to said even memory cells through said first port when said even memory cells are selected, said method comprising the steps of:

(a) selecting said odd memory cells in said row to access using an odd word selection line if said odd memory cells in said row are to be accessed, said odd word selection line coupled to each of said odd memory cells;

(b) selecting said even memory cells in said row to access using an even word selection line if said even memory cells in said row are to be accessed, said even word selection line coupled to each of said even memory cells;

(c) switching said first switching means to access said even memory cells if said even memory cells were selected to be accessed;

(d) switching said first switching means to access said odd memory cells if said odd memory cells were selected to be accessed;

(e) accessing said selected odd or even memory cells through said first port using said first shared bit lines.

21. The method for accessing computer memory cells of a computer memory array as set forth in claim 20 wherein said memory array further comprises at least one additional port coupled to said memory cells for accessing said memory cells concurrently with access of said memory cells through said first port.

22. The method for accessing computer memory cells of a computer memory array as set forth in claim 20 wherein there are a plurality of rows of memory cells, a plurality of odd word selection lines, and a plurality of even word selection lines, each row of memory cells having its own separate odd and even word selection lines, said first shared bit lines coupling corresponding memory cells of each row of memory cells and providing access through said first port to said odd and even memory cells for a selected row, said method further comprising the step of:

(f) selecting said row of memory cells to access such that said odd and even word selection lines corresponding to said row of memory cells to access are selected in steps (a) and (b).

23. The method for accessing computer memory cells of a computer memory array as set forth in claim 22 wherein said memory array further comprises at least one additional port coupled to said memory cells for accessing said memory cells concurrently with access of said memory cells through said first port.

24. The method for accessing computer memory cells of a computer memory array as set forth in claim 20, wherein N is at least greater than three, said memory array further comprises a first dedicated bit line for accessing said first memory cell, said first dedicated bit line being coupled to said first memory cell and to said first port, such that said first memory cell is coupled to said first dedicated bit line and a first bit line of said first shared bit lines and provides access to said first memory cell when said odd memory cells are selected, a last dedicated bit line for accessing said last memory cell, said last dedicated bit line being coupled to said last memory cell and to said first port, such that said last memory cell is coupled to said last dedicated bit line and a last bit line of said first shared bit lines and provides access to said last memory cell when said even memory cells are selected, (N/2)-1 second shared bit lines for accessing said memory cells, each of said second shared bit lines being located between, and coupled to, an adjacent pair of said even and odd memory cells except a first adjacent pair and a last adjacent pair, said first adjacent pair, formed by said first memory cell and a first even memory cell, said last adjacent pair formed by said last memory cell and a last odd memory cell, such that each of said memory cells, except said memory cells of said first and last pairs, is coupled to one of said first shared bit lines and one of said second shared bit lines, and second switching means, coupled to said second shared bit lines and to said first port, for providing access to said odd memory cells, except said first odd memory cell, through said first port when said odd memory cells are selected and for providing access to said even memory cells, except said last even memory cell, through said first port when said even memory cells are selected, wherein said method further comprises the steps of:

(c.1) switching said second switching means to access said even memory cells if said even memory cells were selected to be accessed;

(d.1) switching said second switching means to access said odd memory cells if said odd memory cells were selected to be accessed.

25. The method for accessing computer memory cells of a computer memory array as set forth in claim 24 wherein said memory array further comprises at least one additional port coupled to said memory cells for accessing said memory cells concurrently with access of said memory cells through said first port.

26. The method for accessing computer memory cells of a computer memory array as set forth in claim 24 wherein there are a plurality of rows of memory cells, a plurality of odd word selection lines, and a plurality of even word selection lines, each row of memory cells having its own separate odd and even word selection lines, said first and last dedicated bit lines and said first and second shared bit lines coupling corresponding memory cells of each row of memory cells and providing access through said first port to said odd and even memory cells for a selected row, said method further comprising the step of:

(f) selecting said row of memory cells to access such that said odd and even word selection lines corresponding to said row of memory cells to access are selected in steps (a) and (b).

27. The method for accessing computer memory cells of a computer memory array as set forth in claim 26 wherein said memory array further comprises at least one additional port coupled to said memory cells for accessing said memory cells concurrently with access of said memory cells through said first port.

* * * * *

UNITED STATES PATENT AND TRADEMARK OFFICE
CERTIFICATE OF CORRECTION

PATENT NO. : 5,276,650
DATED : Jan. 4, 1994
INVENTOR(S) : Satoshi Kubota

It is certified that error appears in the above-indentified patent and that said Letters Patent is hereby corrected as shown below:

On the Title page, column 1, line 1;
    insert -- By Bit Line Sharing-- following "Reduction".

Column 3; Line 23; Delete "53"; Insert in place thereof--52--
Column 3; Line 23; Delete "coupled"; Insert in place thereof--couple--

Signed and Sealed this

Tenth Day of October, 1995

Attest:

BRUCE LEHMAN

Attesting Officer        Commissioner of Patents and Trademarks